United States Patent [19]
Terada

[11] Patent Number: 5,563,520
[45] Date of Patent: Oct. 8, 1996

[54] PROBE SYSTEM

[75] Inventor: Akihiro Terada, Tokyo, Japan

[73] Assignee: Tokyo Electron Limited, Tokyo, Japan

[21] Appl. No.: 588,652

[22] Filed: Jan. 19, 1996

Related U.S. Application Data

[63] Continuation of Ser. No. 109,042, Aug. 17, 1993, abandoned.

[30] Foreign Application Priority Data

Aug. 17, 1992 [JP] Japan .................................. 4-240002

[51] Int. Cl.⁶ .............................................. G01R 31/02
[52] U.S. Cl. ........................ 324/754; 324/760; 414/222
[58] Field of Search .................................. 414/222, 223; 324/158 F, 158.1, 754, 760

[56] References Cited

U.S. PATENT DOCUMENTS

| | | | |
|---|---|---|---|
| 4,704,792 | 11/1987 | Itagaki | 414/222 |
| 4,722,298 | 2/1988 | Rubin | 414/222 |
| 4,729,246 | 3/1988 | Melgaard et al. | |
| 4,757,255 | 7/1988 | Margozzi | 324/158 F |
| 5,024,570 | 6/1991 | Kiriseko | 414/222 |
| 5,065,089 | 11/1991 | Rich | 324/760 |
| 5,128,737 | 7/1992 | van der Have | 357/40 |
| 5,353,495 | 10/1994 | Terabayashi | 414/222 |
| 5,388,945 | 2/1995 | Garric | 414/217 |

FOREIGN PATENT DOCUMENTS 2-265255  10/1990  Japan.

*Primary Examiner*—Ernest F. Karlsen
*Assistant Examiner*—Russell M. Kobert
*Attorney, Agent, or Firm*—Oblon, Spivak, McClelland, Maier & Neustadt, P.C.

[57] ABSTRACT

A probe system has a wafer storing section for storing a semiconductor wafer as an object to be measured, a plurality of probe units for electrically measuring the wafer, a marking unit for marking a defective portion of the wafer, a repair unit for repairing the defective portion of the wafer, a baking unit for baking and drying the marked wafer, an inspection unit for detecting and examining the marked portion of the wafer marked by the marking unit, a looped convey path for conveying the wafer along the storing section and the respective units, and a convey mechanism for conveying the wafer along the convey path. Wafer transfer between the wafer storing section and the convey mechanism is performed by a first transfer mechanism, and wafer transfer between the respective units and the convey mechanism is performed by second transfer mechanisms. The probe system also controls the respective units and wafer conveyance. A surrounding member for surrounding the wafer when the wafer is to be conveyed is provided along the convey path, and the interior of the surrounding member is held in an atmosphere of the clean air or a nitrogen gas having a pressure higher than the atmospheric pressure.

32 Claims, 5 Drawing Sheets

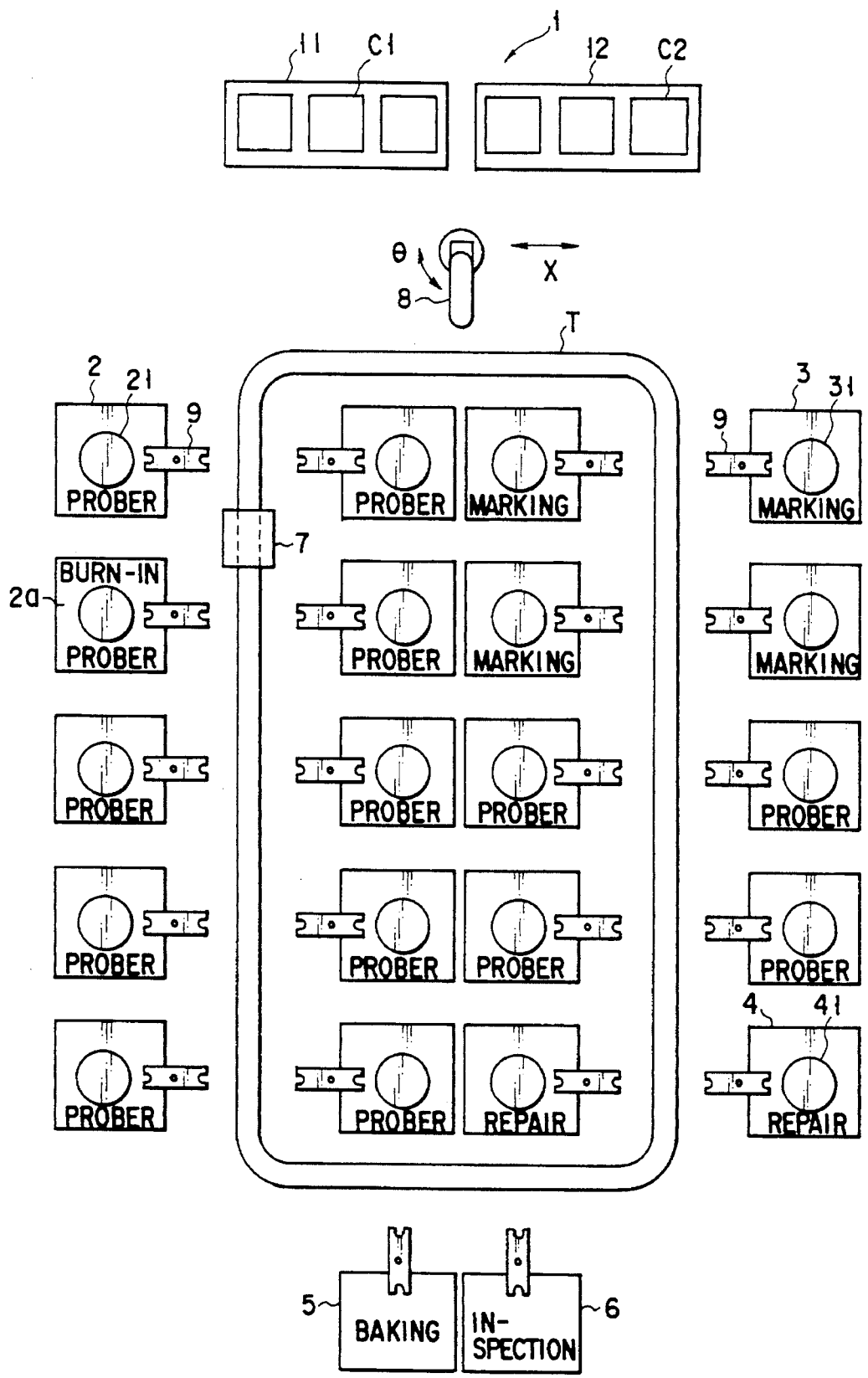
F I G. 1

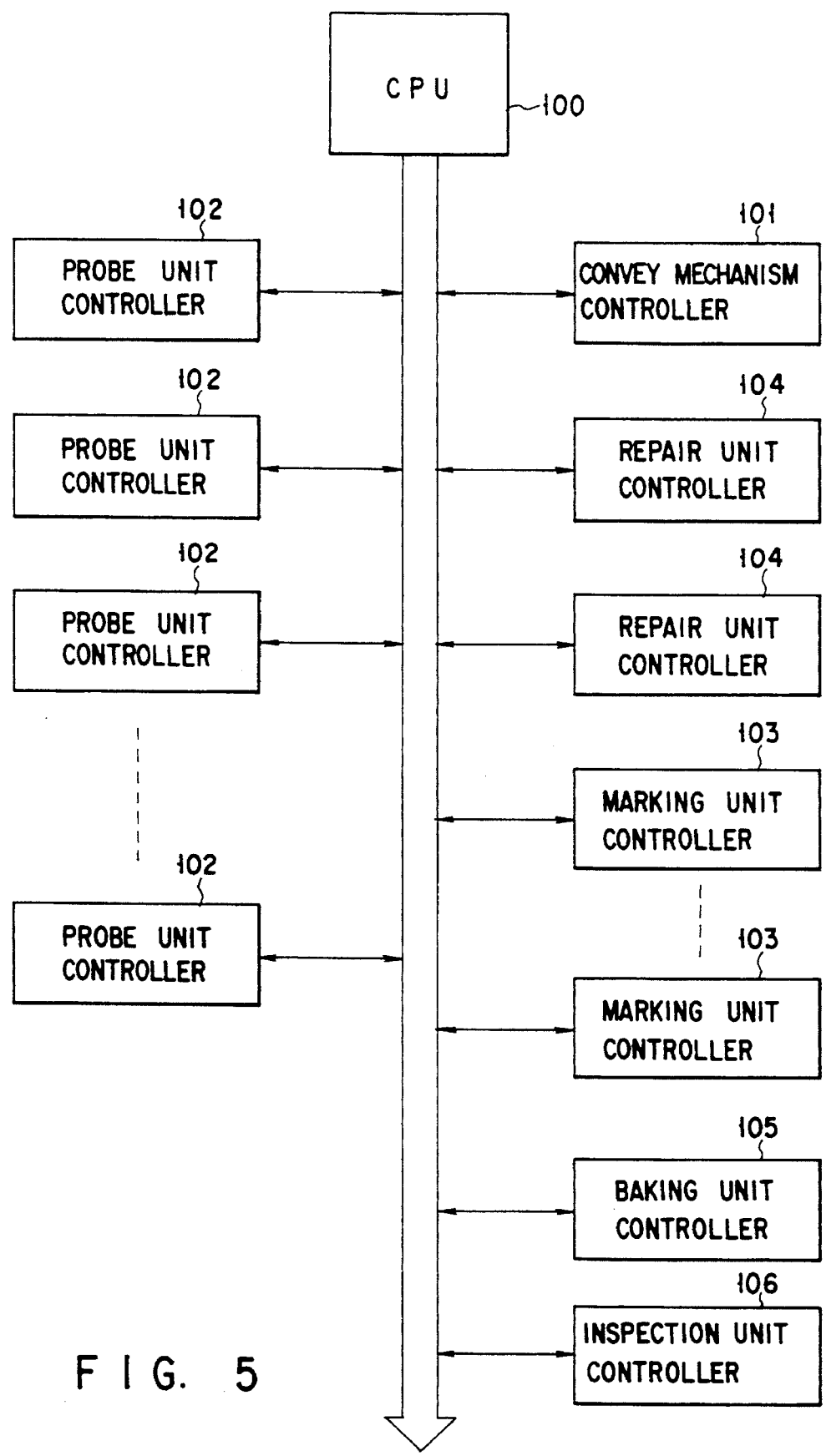
F I G. 5

PROBE SYSTEM

This application is a continuation of application Ser. No. 08/109,042, filed on Aug. 17, 1993, now abandoned.

BACKGROUND OF THE INVENTION

1. Field of the Invention

The present invention relates to a probe system comprising a plurality of probe units for measuring the electric characteristics of an object to be measured, e.g., a semiconductor wafer.

2. Description of the Related Art

In a semiconductor device manufacturing process, IC chips are completed in a wafer, the wafer is cut into chips, and thereafter the chips are packaged. The respective chips in the wafer are subjected to an electric measurement called a probe test by a probe apparatus before packaging in order to eliminate a defective chip.

A conventional probe apparatus has a box, a measurement stage provided at the central portion in the box and movable in the X, Z, and θ directions, a probe card provided above the measurement stage and having a plurality of probes, and a wafer transfer chamber provided next to the measurement stage in the box. For example, upper and lower wafer carriers and a transfer mechanism for transferring wafers between the wafer carriers and the measurement stage are provided in the wafer transfer chamber.

In this probe apparatus, four wafer carriers each storing, for example, 25 wafers are arranged in the wafer transfer chamber. One wafer is taken out from each carrier and placed on the measurement stage by the transfer mechanism. Subsequently, the electrode pads of the IC chips of this wafer are electrically connected to a test head through the probes to perform measurement. When the measurement is completed, this wafer is returned to the wafer carrier by the transfer mechanism. When measurement of all the wafers is completed, these four wafer carriers are replaced by four new wafer carriers by an operator.

In this manner, the probe apparatus performs measurement in units of wafers. Since a time required for measuring one wafer sometimes exceeds one hour, a large number of, for example, 100 or more probe apparatus are often installed in a clean room in order to increase the throughput.

The conventional probe apparatus has, however, the wafer transfer chamber in addition to members required for measurement, such as the measurement stage and the probe card, as described above. Since four wafer cassettes are housed in the wafer transfer chamber each time in order to improve the operation efficiency, the space occupied by the transfer chamber is rather large. Recently, as the diameter of the wafer is being increased from 6 inches to 8 inches, the transfer mechanism becomes complicated, leading to an increase in size of the probe apparatus. When a large number of probe apparatus are installed, as described above, a large proportion of the space of the expensive clean room is occupied by only the probe apparatus.

When a large number of probe apparatus are arranged in this manner and wafers are conveyed to the respective probe apparatus, particles are produced and attach to the wafers during conveyance.

Furthermore, when the large number of probe apparatus are arranged in the clean room, it is difficult to perform efficient electrical measurement of wafers using all the probe apparatus.

SUMMARY OF THE INVENTION

The present invention has been made in view of the above situation and has as its object to provide a probe system capable of decreasing a space.

It is another object of the present invention to provide a probe system capable of preventing particles from attaching to an object to be measured during conveyance of the object to be measured.

It is still another object of the present invention to provide a probe system capable of efficiently measuring an object to be measured by using a large number of probe units.

According to the first aspect of the present invention, there is provided a probe system comprising: a storing section for storing an object to be measured; a plurality of probe units for electrically measuring the object; process means for performing a predetermined process to the object accompanying measurement by the probe units; a convey path for conveying the object along the storing section, the probe units, and the process means; a convey mechanism for conveying the object along the convey path; a first transfer mechanism for transferring the object between the storing section and the convey mechanism; a second transfer mechanism for transferring the object between the probe units and the convey mechanism, and between the process means and the convey mechanism; control means for controlling the probe units, the process means, and conveyance of the object; and holding means for holding the object which is conveyed along the convey path in an atmosphere of clean air or a nitrogen gas having a pressure higher than an atmospheric pressure.

According to the second aspect of the present invention, there is provided a probe system comprising: a storing section for storing an object to be measured; a plurality of probe units for electrically measuring the object; process means for performing a predetermined process to the object accompanying measurement by the probe units; a looped convey path for conveying the object along the storing section, the probe units, and the process means; a convey mechanism for conveying the object along the convey path; a first transfer mechanism for transferring the object between the storing section and the convey mechanism; a second transfer mechanism for transferring the object between the probe units and the convey mechanism, and between the process means and the convey mechanism; and control means for controlling the probe units, the process means, and conveyance of the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic plan view for explaining the entire layout of a probe system according to an embodiment of the present invention;

FIG. 5 is a block diagram showing an example of a control system of the probe system;

DETAILED DESCRIPTION OF THE PREFERRED EMBODIMENTS

Figure 2:
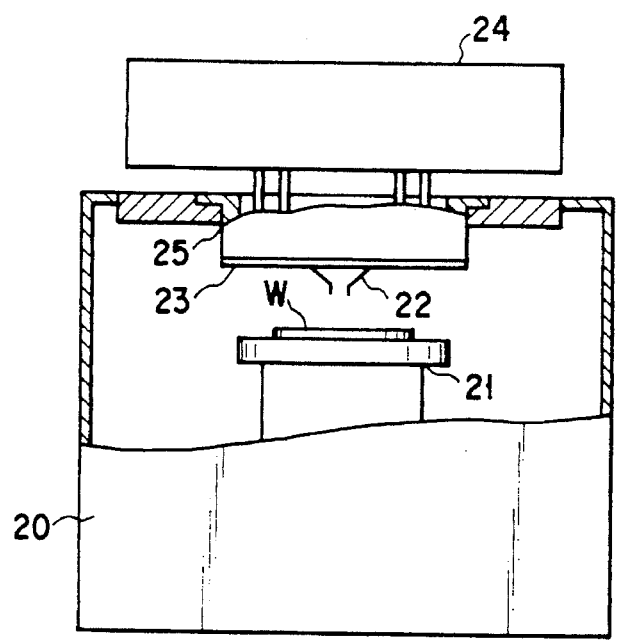
FIG. 2 is a partially cutaway side view showing a schematic arrangement of a probe unit using the probe system of FIG. 1.

FIG. 1 is a schematic plan view showing the entire layout of a probe system according to an embodiment of the present invention. As shown in FIG. 1, a carrier storing section 1 for storing wafer carriers, 13 probe units (to be described as probers in FIG. 1), 2 for measuring the electric characteristics of a semiconductor wafer as an object to be measured, a probe unit 2a having a burn-in function, four marking units 3, two repair units 4, a baking unit 5, and an inspection unit 6 are arranged along a looped convey path T. A convey mechanism 7 for conveying, e.g., 25 wafers stored in a wafer carrier along the convey path T is provided to the convey path T. Of these units, the marking units 3, the repair units 4, the baking unit 5, and the inspection unit 6 are used for performing, after measurement by the probe units 2, processes necessary for measurement by the probe units 2, as will be described later.

In FIG. 1, predetermined numbers of the probe units 2 and 2a, marking units 3, and repair units 4 are arranged such that the same units face each other to sandwich the convey path, thereby forming pairs. The number and layout of the respective units are arbitrarily set in accordance with the system requirements.

Second transfer mechanisms 9 for transferring wafers between corresponding units and the convey mechanism 7 are provided between the convey path T and the following units, i.e., the probe units 2 and 2a, the marking units 3, the repair units 4, the baking unit 5, and the inspection unit 6.

The carrier storing section 1 has a loading carrier container 11 and an unloading carrier container 12 and is provided to oppose the convey path T through a first transfer mechanism 8. A plurality (three in FIG. 1) of wafer carriers C1 each for storing, for example, 25 wafers before measurement are placed on the loading carrier container 11, and a plurality (three in FIG. 1) of wafer carriers C2 for storing wafers after measurement are placed on the unloading carrier container 12.

The first transfer mechanism 8 transfers wafers before measurement in the loading carrier container 11 to a carrier C provided in the convey mechanism 7, and wafers after measurement in the carrier C of the convey mechanism 7 to the unloading carrier container 12. The first transfer mechanism 8 is constituted by, for example, robot arms capable of horizontal and vertical movements and rotations.

In each probe unit 2, a wafer is placed on a measurement stage 21, and a large number of probes provided to a probe card are brought into contact with the electrode pads of the IC chips of the wafer, thereby performing electric measurement of the IC chips. For example, each probe unit 2 has an arrangement shown in FIG. 2. The measurement stage 21 movable in the X, Y, Z, and θ directions is placed in a box 20. A probe card 23 having probes 22 is provided above the measurement stage 21. The probe card 23 is fixed to the box 20 through an insert ring 25. Wiring lines extending from the probe card 23 are connected to a tester (not shown) through a test head 24. In this probe unit, a wafer W is chucked on the measurement stage 21, the probes 22 are brought into contact with the large number of electrode pads of the IC chips of the wafer W, the probes 22 are electrically connected to the tester through the test head 24, and a predetermined measurement is performed by the tester.

The basic arrangement of the probe unit 2a having the burn-in function is similar to that of the probe unit 2, except that the tester incorporated in the probe unit 2a has the burn-in test function. The burn-in test is a screening test in which thermally and electrically severe stresses are applied to an IC so that potential defects of the IC appear. With this test, potential defects can be prevented from appearing after packaging to cause a trouble. In this case, a pulse stress, a voltage stress, and the like are applied as the electrical stresses. A thermal stress is applied using a heater and a cooler incorporated in the measurement stage 21. The number of probe units having the burn-in function as described above may be two or more.

Each marking unit 3 has a stage 31 for placing a wafer W thereon and marks a defective chip of the wafer W placed on the stage 31 in accordance with, for example, the ink-jet scheme based on the measurement result obtained by the probe units 2.

Each repair unit 4 has a stage 41 for placing a wafer W thereon and repairs the defective portion of the wafer W marked by the marking units 3 based on the measurement result obtained by the probe units 2. The repair unit 4 can be one for cutting the wafer w only at a defective portion thereof that can be repaired in units of bits by, for example, a focused ion beam, one for connecting an open portion of the wafer W by a sputter gas, and the like.

The probe units 2 and 2a, the marking units 3, and the repair units 4 are constituted such that they can pre-align the wafers W on the stages 21, 31, and 41.

The baking unit 5 has a function of baking and drying a marked wafer W.

The inspection unit 6 has, for example, a microscope, a display, and an image analyzer. The inspection unit 6 has a function of detecting and inspecting a portion marked by the marking units 3.

Figure 3:
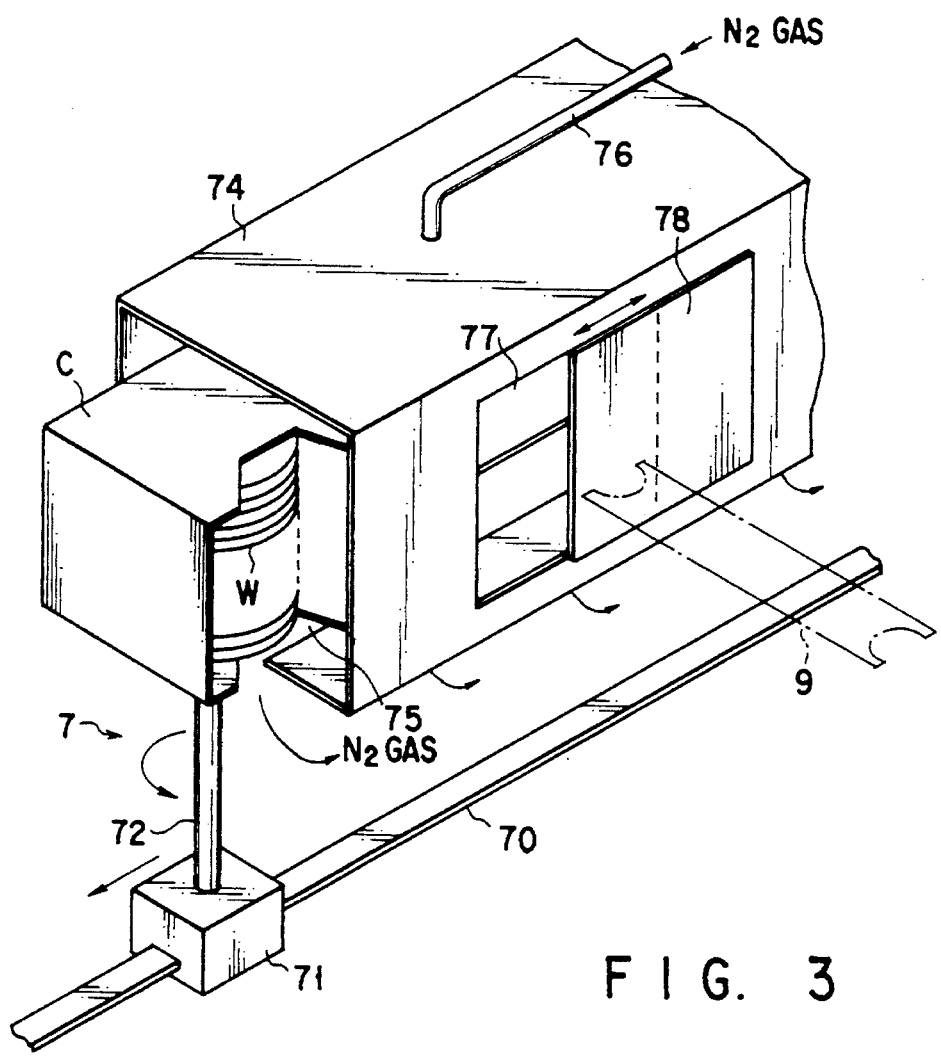
FIG. 3 is a perspective view showing a convey mechanism and a gas seal member used in the probe system of FIG. 1.

As shown in FIG. 3, the convey mechanism 7 has a movable portion 71 movable along the convey path T, a rotating shaft 72 extending upward from the movable portion 71, and the wafer carrier C fixed on the rotating shaft 72 through a holding table (not shown in FIG. 3). The convey path T has a rail 70. The movable portion 71 moves along the convey path T as it is guided by the rail 70. A rotary motor (not shown) for rotating the rotating shaft 72 and a drive motor (not shown) for moving the movable portion 71 along the rail 70 are incorporated in the movable portion 71. The carrier C fixed to the rotating shaft 72 is rotated by the rotary motor, and the wafers W in the carrier C are conveyed by the drive motor along the convey path T.

A cover member 74 is disposed along the convey path T to surround the moving region of the carrier C. A slit 75 is formed in the lower surface of the cover member 74 so that the rotating shaft 72 can pass through it. A gas inlet pipe 76 is connected to the cover member 74. For example, a nitrogen gas or clean air is constantly supplied to the interior of the cover member 74 through the gas inlet pipe 76 and blown out from the cover member 74 through the slit 75. Therefore, the interior of the cover member 74 is set at a pressure higher than the atmospheric pressure. An opening 77 used for wafer transfer and a shutter 78 for opening/closing the opening 77 are formed at portions of the side surface of the cover member 74 that correspond to the first and second transfer mechanisms 8 and 9. When the moving region of the carrier C (i.e., the moving region of the wafer w) is set at a pressure higher than the atmospheric pressure in this manner by, for example, the nitrogen gas, attachment of particles can be decreased during conveyance of the wafers W by the convey mechanism 7 to the wafers W.

Figure 4:
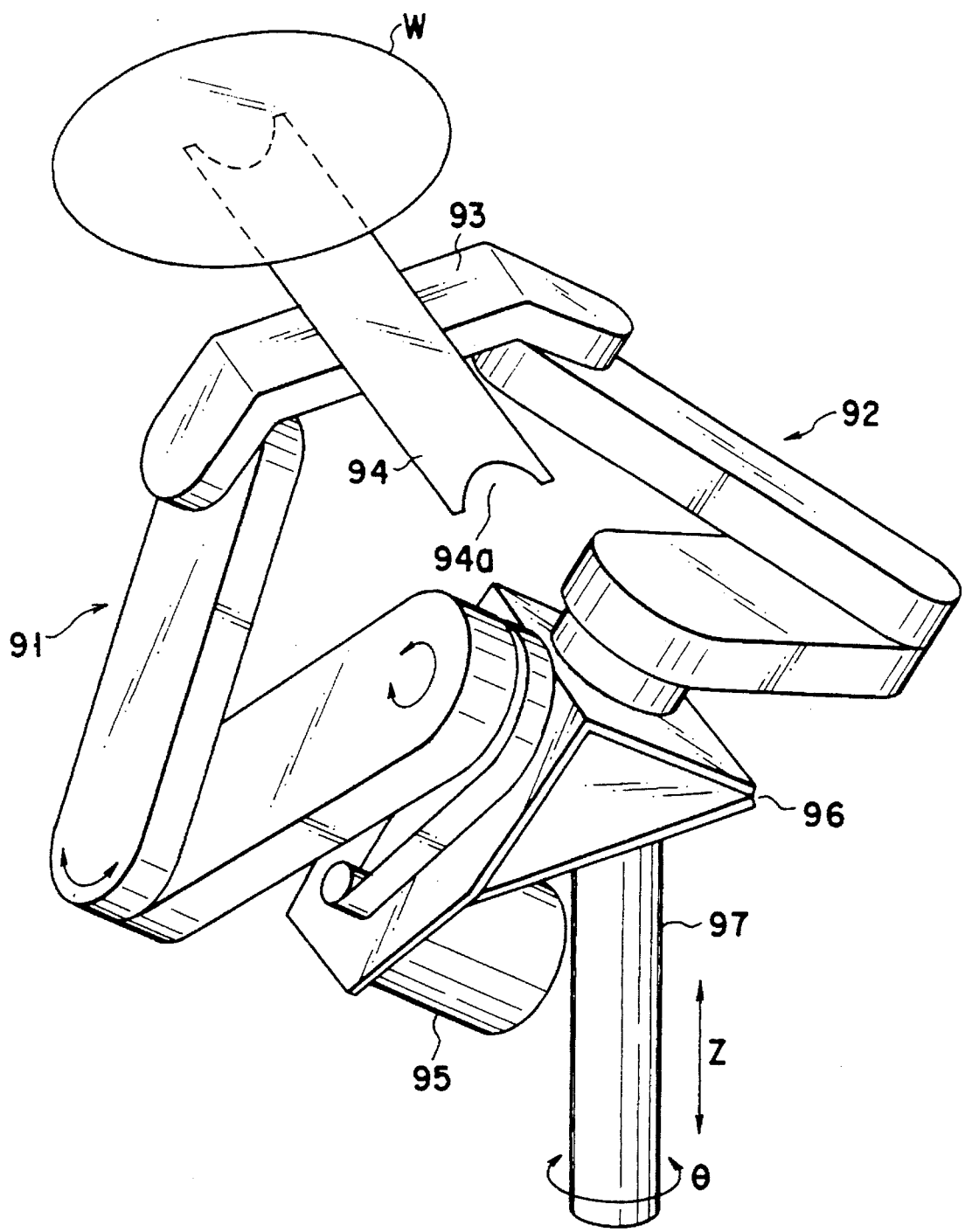
FIG. 4 is a perspective view showing an example of a second transfer mechanism.

Each second transfer mechanism 9 has, for example, a structure shown in FIG. 4. The second transfer mechanism 9 has a pair of articulated arms 91 and 92 which are inclined so that their movable flat surfaces intersect. A coupling portion 93 for rotatably coupling the articulated arms 91 and 92 are provided at one end of each of the arms 91 and 92. A tweezer 94 having notche 94a and chuck portions, for example, vacuum chucks, formed at its two ends are fixed to the coupling portion 93. The other end side of each of the arms 91 and 92 is mounted to a base 96 having a driving section 95, so that the arms 91 an 92 are driven by the driving section 95. A shaft 97 is coupled to the base 96. When the shaft 97 is driven in the θ and Z directions by a driving section (not shown), the base 96 is driven in the θ and Z directions.

The probe system having the layout as described above is entirely controlled by a control system. An example of this control system will be described with reference to FIG. 5. A CPU 100 controls the entire system, and has a function of managing and storing the types and numbers of lots of the respective carriers in the carrier storing section 1, information regarding whether or not the probe units 2 and 2a, the marking units 3, the repair units 4, the baking unit 5, and the inspection unit 6 are in use or in the standby state, and the defective chip address, the content of defect, and the like of a wafer measured by the probe units 2. The CPU 100 is connected to a convey mechanism controller 101, probe unit controllers 102, marking unit controllers 103, repair unit controllers 104, a baking unit controller 105, and an inspection unit controller 106.

The convey mechanism controller 101 controls the convey mechanism 7. The probe unit controllers 102 control wafer loading/unloading of the probe units 2 and 2a, the marking units 3, the repair units 4, the baking unit 5, and the inspection unit 6 separately. A series of management operations of the wafer conveyed by the convey mechanism 7 are performed by an identification code attaching to this wafer, reading the identification code by, for example, the respective units, and obtaining a correspondence between the identification code and information regarding this wafer by the CPU 100.

The operation of the probe system having the arrangement as described above will be described. For example, 25 wafers before measurement are transferred from one carrier C1 of the loading carrier container 11 into the carrier C of the convey mechanism 7 by the first transfer mechanism 8. The convey mechanism 7 is conveyed along the convey path T, and the wafers mounted on the convey mechanism 7 are loaded on a given probe unit 2 one by one through the corresponding second transfer mechanism 9. Regarding loading to a given probe unit 2, the convey mechanism 7 is stopped at a position opposing this probe unit 2. Then, the shutter 78 (see FIG. 3) of the cover member 74 is opened. One end of the tweezer 94 of the second transfer mechanism 9 is introduced into the carrier C to receive each wafer. The tweezer 94 are rotated by 180° to supply each wafer onto the measurement stage 21 of this probe unit 2.

In the probe unit 2, pre-alignment is performed by, for example, an optical sensor, and the probes 22 are brought into contact with the electrode pads of the IC chips of the wafer to perform electrical measurement by a tester (not shown).

Since the measurement start timings of the respective probe units 2 are shifted, measurement end times of wafers which are measured within a predetermined period of time are also shifted. Accordingly, by control of the convey mechanism controller 101, the convey mechanism 7 is sequentially moved to and stopped at positions opposing the probe units 2 that have ended measurement, and wafers after measurement are unloaded by the second transfer mechanisms 9 and stored in the carrier C. In this case, a wafer after measurement is received at one end of the tweezer 94 of a given second transfer mechanism 9 from the corresponding measurement stage 21, and a new wafer is received at the other end of the tweezer 94 from the convey mechanism 7. When the tweezer 94 is rotated by 180°, wafer loading and unloading operations to and from the probe units 2 are performed simultaneously.

The probe unit 2a having the burn-in function performs the wafer burn-in test as well.

A wafer after measurement is conveyed by the convey mechanism 7 to a position opposing a given marking unit 3 and loaded on it in the same manner as it is loaded on the given probe unit 2. A defective chip of this wafer is marked based on the defective chip information stored in the CPU 100. The marked wafer is conveyed to a position opposing the baking unit 5 by the convey mechanism 7, and loaded in the baking unit 5. The wafer is baked and dried in the baking unit 5. Thereafter, the wafer is conveyed to a position opposing the inspection unit 6 by the convey mechanism 7, and is loaded on the inspection unit 6. The marked portion of this wafer is detected and inspected by the inspection unit 6. The result of the detection and inspection is input to the CPU 100. If the wafer has a chip which is determined by the CPU 100 to be able to be repaired in units of bits, this wafer is conveyed to a position opposing a given repair unit 4 and is loaded on the repair unit 4, thereby executing repair in units in bits. Thereafter, this wafer is re-measured by the probe unit 2 to confirm whether or not the repair is appropriate.

A marked wafer, a wafer having no defective chip, and a repaired wafer are stored in the carriers C2 in the unloading carrier container 12 through the convey mechanism 7 and the first transfer mechanism 8.

The CPU 100 constantly monitors whether the probe units 2 are in measurement or have completed measurement. When a given probe unit 2 has completed measurement, the CPU 100 supplies wafers to it immediately, thereby improving the throughput. For this purpose, if a wafer before measurement does not exist in the carrier C of the convey mechanism 7, the convey mechanism 7 is moved to a position opposing the first transfer mechanism 8, and wafers in the loading carrier container 11 are replenished in the convey mechanism 7. The replenishing timing is selected by determination of the CPU 100 when, for example, a wafer after measurement is to be returned to the unloading carrier container 12.

With this arrangement, wafers before measurement are replenished and stored in the carrier C of the convey mechanism 7 as required. When the measurement operation of a given probe unit 2 is ended, new wafers are immediately loaded from the carrier C to this probe unit 2. As a result, efficient measurement can be performed.

According to the probe system having the arrangement as described above, probe units and process units that perform processes necessary for the probe test are arranged along the convey path, and wafers as objects to be measured are transferred with these units by using a convey mechanism. Therefore, a storage space for the large number of objects to be inspected need not be prepared in each unit, so that the units can be decreased in size, thereby decreasing the space. When the wafers are conveyed along the convey path, the wafers are placed in an atmosphere of clean air or nitrogen gas having a pressure higher than the atmospheric pressure. Therefore, particle attachment to the wafers that has occurred along with wafer conveyance can be decreased. Wafer conveyance to the respective units is performed by forming the convey path to have a looped shape and, at the same time, wafer conveyance and the process operations by the respective units are controlled by the control system. Therefore, wafer measurement can be performed very efficiently.

In this embodiment, the convey mechanism 7 is provided with the carrier C of its own to perform wafer transfer with the carrier storing section 1 in units of wafers. However, a plurality of carriers C may be loaded on the convey mechanism 7, and wafer transfer may be performed in units of carriers. Furthermore, both wafer transfer in units of wafers and wafer transfer in units of carriers may be performed. In this case, a carrier transfer mechanism may be added to a first transfer mechanism 8.

A carrier storing section 1 may be moved in the X direction in place of moving the first transfer mechanism 8 in the X direction. The carrier storing section 1 may be constituted by a turntable.

A convey mechanism 7 may be moved by using a belt, in addition to being moved along a rail. A plurality of convey mechanisms 7 may be provided along a convey path T.

A second transfer mechanism 9 need not be provided for each unit, but may be provided for a plurality of units.

Figure 6:
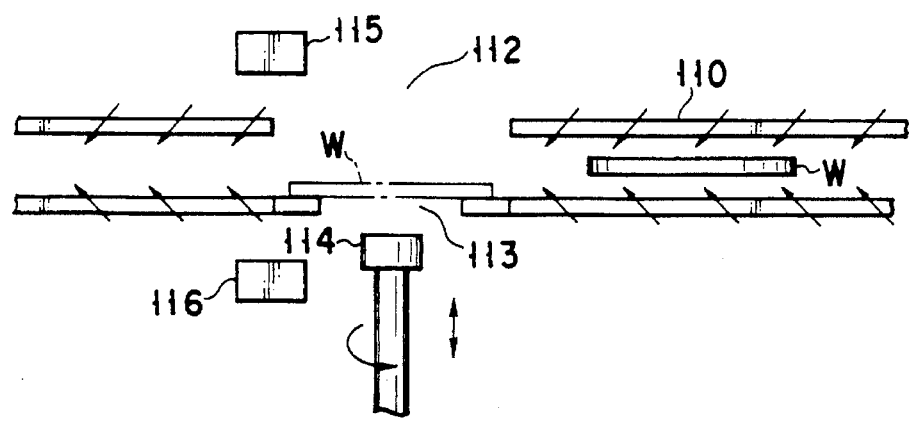
FIG. 6 is a sectional view showing the wafer convey path of a probe system according to another embodiment of the present invention.
Figure 7:
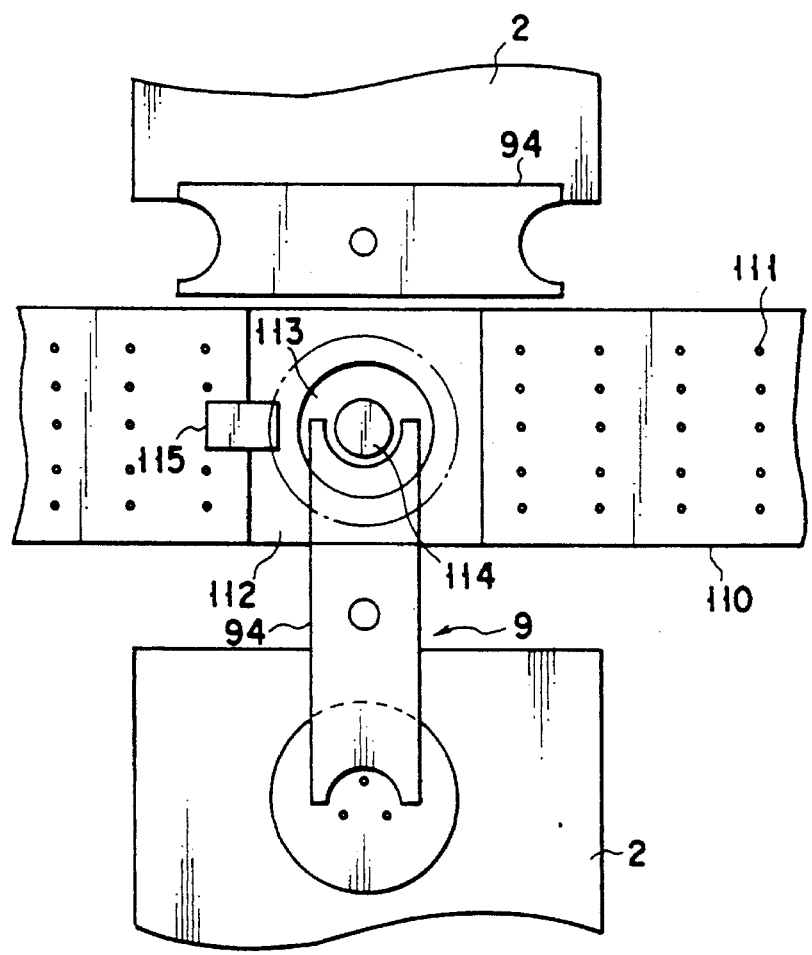
FIG. 7 is a plan view showing a state wherein a wafer is transferred from the wafer convey path of FIG. 6 to each unit.

In the present invention, the wafers may also be conveyed one by one along the convey path. This example is shown in FIGS. 6 and 7. In this example, a flat cylindrical convey path member 110 having a width slightly larger than the size of a wafer is arranged along a convey path T. A large number of injection holes 111 (only a gas injecting direction is shown in FIG. 6 for the sake of illustrative convenience) are formed in the upper and lower surfaces of the convey path member 110 in a row in the widthwise direction and obliquely with respect to the wafer convey direction to inject clean air, a nitrogen gas, or the like. Such rows are arranged in the longitudinal direction. Clean air or nitrogen gas is injected from a gas supply unit (not shown) into the convey path member 110 through the injection holes 111, so that the wafers are conveyed in the convey path member 110 one by one.

In the two surfaces of the convey path member 110, notched portions 112 and 113 are formed at stop positions of wafers W corresponding to the respective ones of probe units 2, a probe unit 2a, marking units 3, repair units 4, a baking unit 5, and an inspection unit 6. The notched portions 113 in the lower surface of the convey path member 110 have a size to hold the peripheries of the wafers. A wafer chuck 114 for holding a wafer by vacuum is provided below each notched portion 113 to be vertically movable and rotatable. Light-emitting and light-receiving sensors 115 and 116 for pre-alignment are arranged at positions of the convey path member 110 to sandwich the upper and lower surfaces of the periphery of each wafer W.

A wafer W stopped at a stop position is held and then pre-aligned by the corresponding wafer chuck 114, and transferred to a corresponding unit by the tweezer 94 of the second transfer mechanism 9 in the same manner as in the embodiment described above. The wafer W can be stopped by projecting a stopper pin (not shown) at a predetermined position. In this embodiment, the wafer W is conveyed in advance by control of the CPU 100 to a position in front of a probe unit 2 that should complete measurement most immediately. Then, the wafer W can be efficiently transferred to this probe unit 2.

In the above description, the repair units and the marking units correspond to post-process units used after wafer measurement. In the present invention, a pre-process unit may be provided for measuring the breakdown voltage of, for example, four to five chips before, e.g., wafer measurement.

In the present invention, the object to be inspected is not limited to a semiconductor wafer but can be, e.g., an LCD substrate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A probe system comprising:

a storing section for storing an object to be measured;

a plurality of probe units for electrically measuring the object;

process means for performing a predetermined process to the object accompanying measurement by said probe units, wherein said process means includes a marking unit for marking a defective portion of the object, and a repair unit for repairing the defective portion of the object;

a convey path for conveying the object along said storing section, said probe units, and said process means;

a cover member for covering the convey path;

a first transfer mechanism for transferring the object between said probe units and said convey mechanism, and between said process means and said convey mechanism;

control means for controlling said probe units, said process means, and conveyance of the object; and holding means for holding the object which is conveyed along said convey path in an atmosphere of clean air or a nitrogen gas having a pressure higher than an atmospheric pressure by injecting clean air or nitrogen gas into the cover member.

2. The probe system according to claim 1, wherein said control means comprises a CPU for controlling an entire system, a convey mechanism controller for controlling said convey mechanism, a probe unit controller for controlling loading and unloading of the object in said probe units, and a process means controller for controlling loading and unloading of the object by said process means.

3. The probe system according to claim 1, wherein said process means further includes a baking unit for baking the marked object and drying the marked portion, and an inspection unit for detecting and examining a portion of the object which is marked by said marking unit.

4. The probe system according to claim 1, wherein at least one of said probe units has a burn-in test function which is applied a thermal stress and an electrical stress to the object.

5. The probe system according to claim 1, wherein said holding means has a surrounding member, provided along said convey path and substantially closed, for surrounding the object, and clean air or a nitrogen gas is supplied into said surrounding member, and the object passes through said surrounding member.

6. The probe system according to claim 1, wherein said convey mechanism has a carrier for placing a plurality of objects to be inspected thereon.

7. The probe system according to claim 6, wherein said convey path has a rail for guiding said convey mechanism.

8. The probe system according to claim 1, wherein said convey path has a cylindrical member through which the object is conveyed.

9. The probe system according to claim 8, wherein said convey mechanism supplies clean air or a nitrogen gas to said cylindrical member and conveys the object with a flow of the gas or clean air.

10. The probe system according to claim 1, wherein said control means has a first control section for controlling conveyance of the object, and a second control section for receiving information of a measurement result from said probe units and a processing result from said process means, and controlling said probe units and said process means on the basis of the information.

11. A probe system comprising:

a storing section for storing an object to be measured;

a plurality of probe units for electrically measuring the object;

process means for performing a predetermined process to the object accompanying measurement by said probe units;

a looped convey path for conveying the object along said storing section, said probe units, and said process means, wherein the looped convey path has an inner area inside of the loop and an outer area outside of the loop in which the probe units and process means may be located;

a convey mechanism for conveying the object along said convey path;

a cover member for covering the convey path;

a first transfer mechanism for transferring the object between said storing section and said convey mechanism;

a second transfer mechanism for transferring the object between said probe units and said convey mechanism, and between said process means and said convey mechanism;

control means for controlling said probe units, said process means, and conveyance of the object; and means for injecting clean air or nitrogen gas into the cover member.

12. The probe system according to claim 11, further comprising holding means for holding the object which is conveyed along said looped convey path in an atmosphere of clean air or a nitrogen gas having a pressure higher than an atmospheric pressure.

13. The probe system according to claim 12, wherein said holding means has a surrounding member, provided along said convey path and substantially closed, for surrounding the object, and clean air or a nitrogen gas is supplied into said surrounding member, and the object passes through said surrounding member.

14. The probe system according to claim 11, wherein said process means includes a marking unit for marking a defective portion of the object, and a repair unit for repairing the defective portion of the object.

15. The probe system according to claim 14, wherein said process means further includes a baking unit for baking the marked object and drying the marked portion, and an inspection unit for detecting and examining a portion of the object which is marked by said marking unit.

16. The probe system according to claim 11, wherein at least one of said probe units has a burn-in test function which is applies a thermal stress and an electrical stress to the object.

17. The probe system according to claim 11, wherein said convey mechanism has a carrier for placing a plurality of objects thereon.

18. The probe system according to claim 17, wherein said convey path has a rail for guiding said convey mechanism.

19. The probe system according to claim 11, wherein said convey path has a cylindrical member through which the object is conveyed.

20. The probe system according to claim 19, wherein said convey mechanism supplies clean air or a nitrogen gas to said cylindrical member and conveys the object with a flow of the gas or clean air.

21. The probe system according to claim 11, wherein said control means has a first control section for controlling conveyance of the object, and a second control section for receiving information of a measurement result from said probe units and a processing result from said process means, and controlling said probe units and said process means on the basis of the information.

22. The probe system according to claim 12, wherein said control means comprises a CPU for controlling an entire system, a convey mechanism controller for controlling said convey mechanism, a probe unit controller for controlling loading and unloading of the object in said probe units, and a process means controller for controlling loading and unloading of the object by said process means.

23. The probe system according to claim 11, wherein at least one of the plurality of probe units and process means is formed inside of the looped convey path.

24. A probe system comprising:

a storing section for storing an object to be measured;

a plurality of probe units for electrically measuring the object;

process means for performing a predetermined process to the object accompanying measurement by said probe units, wherein said process means includes a marking unit for marking a defective portion of the object, and a repair unit for repairing a defective portion of the object;

a looped convey path for conveying the object along said storing section, said probe units, and said process means, wherein the looped convey path has an inner area inside of the loop and an outer area outside of the loop in which the probe units and process means may be located;

a convey mechanism for conveying the object along said convey path;

a cover member for covering the convey path;

a first transfer mechanism for transferring the object between said storing section and said convey mechanism and between said process means and said convey mechanism;

a second transfer mechanism for transferring the object between said probe units and said convey mechanism, and between said process means and said convey mechanism;

control means for controlling said probe units, said process means, and conveyance of the object; and holding means for holding the object which is conveyed along said convey path in an atmosphere of clean air or a nitrogen gas having a pressure higher than an atmospheric pressure by injecting clean air or nitrogen gas into the cover member.

25. The probe system according to claim 24, wherein said control means comprises a CPU for controlling an entire system, a convey mechanism controller for controlling said convey mechanism, a probe unit controller for controlling loading and unloading of the object in said probe units, and a process means controller for controlling loading and unloading of the object by said process means.

26. The probe system according to claim 24 wherein said process means further includes a baking unit for baking the marked object and drying the marked portion, and an inspection unit for detecting and examining a portion of the object which is marked by said marking unit.

27. The probe system according to claim 24, wherein at least one of said probe units has a burn-in test function which is applied a thermal stress and an electrical stress to the object.

28. The probe system according to claim 24, wherein said holding means has a surrounding member, provided along said convey path and substantially closed, for surrounding the object, and the clean air or nitrogen gas is supplied into said surrounding member, and the object passes through said surrounding member.

29. The probe system according to claim 24, wherein said convey mechanism has a carrier for placing a plurality of objects to be inspected thereon.

30. The probe system according to claim 29, wherein said convey path has a rail for guiding said convey mechanism.

31. The probe system according to claim 24, wherein said convey path has a cylindrical member through which the object is conveyed.

32. The probe system according to claim 24, wherein said control means has a first control section for controlling conveyance of the object, and a second control section for receiving information of a measurement result from said probe units and a processing result from said process means, and controlling said probe units and said process means on the basis of the information.

* * * * *